US010182505B2

(12) United States Patent
Ochii (10) Patent No.: US 10,182,505 B2
(45) Date of Patent: Jan. 15, 2019

(54) CIRCUIT BOARD AND CIRCUIT MODULE (71) Applicant: Murata Manufacturing Co., Ltd., Kyoto (JP)

(72) Inventor: Akihiro Ochii, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 66 days.

(21) Appl. No.: 15/370,045

(22) Filed: Dec. 6, 2016

(65) Prior Publication Data
US 2017/0086319 A1 Mar. 23, 2017

Related U.S. Application Data (63) Continuation of application No. PCT/JP2015/067866, filed on Jun. 22, 2015.

(30) Foreign Application Priority Data

Jun. 26, 2014 (JP) ................................. 2014-131187

(51) Int. Cl.
H04B 1/00 (2006.01)
H05K 5/02 (2006.01)
(Continued)

(52) U.S. Cl.
CPC ............. *H05K 5/0256* (2013.01); *H04B 1/38* (2013.01); *H04B 1/40* (2013.01); *H05K 1/029* (2013.01);
(Continued)

(58) Field of Classification Search
CPC ............ H04B 1/38; H04B 1/40; H04B 7/043; H04W 84/12
(Continued)

(56) References Cited

U.S. PATENT DOCUMENTS

2008/0159363 A1* 7/2008 Rofougaran ........... H01Q 23/00
375/219
2008/0207170 A1* 8/2008 Khetawat ............ H04W 60/005
455/411
(Continued)

FOREIGN PATENT DOCUMENTS

JP 2003-078442 A 3/2003
JP 2006-108908 A 4/2006
(Continued)

OTHER PUBLICATIONS

International Search Report for PCT/JP2015/067866 dated Aug. 25, 2015.
Written Opinion for PCT/JP2015/067866 dated Aug. 25, 2015.

*Primary Examiner* — Ping Y Hsieh
(74) *Attorney, Agent, or Firm* — Pearne & Gordon (57) ABSTRACT A circuit board includes a board base element, a communication circuit connection terminal, an antenna connection terminal, and a circuit pattern including wires and lands to which predetermined circuit elements are mountable. The predetermined circuit elements include optional elements including a first coil and a second capacitor. The optional elements are electronic components to be mounted or not in the circuit pattern depending on whether a second antenna is connected to a second antenna connection terminal. The predetermined circuit elements further include basic elements including a first capacitor and first and second filters. The basic elements are electronic components to be mounted in the circuit pattern regardless of whether the optional elements are mounted. The circuit pattern is formed such that the single circuit board can optionally support plural types of antenna configurations by changing a manner of mounting the optional elements and changing the circuit configuration.

7 Claims, 7 Drawing Sheets (51) Int. Cl.
   *H04B 1/38*    (2015.01)
   *H04B 1/40*    (2015.01)
   *H05K 1/02*    (2006.01)
   *H05K 1/18*    (2006.01)
   *H04B 7/0413*  (2017.01)
   *H04W 84/12*   (2009.01)

(52) U.S. Cl.
   CPC ............ *H05K 1/0237* (2013.01); *H05K 1/18* (2013.01); *H04B 7/0413* (2013.01); *H04W 84/12* (2013.01); *H05K 1/0243* (2013.01); *H05K 2201/10015* (2013.01); *H05K 2201/10098* (2013.01); *H05K 2201/10121* (2013.01)

(58) Field of Classification Search
   USPC ............................. 455/436, 444, 41.2, 552.1
   See application file for complete search history.

(56) References Cited

U.S. PATENT DOCUMENTS

| | | |
|---|---|---|
| 2009/0040117 A1 | 2/2009 | Miyaura et al. |
| 2009/0185512 A1 | 7/2009 | Hayakawa |
| 2014/0269650 A1* | 9/2014 | Sahota .................. H04W 84/12 370/338 |

FOREIGN PATENT DOCUMENTS

| | | |
|---|---|---|
| JP | 2009-044227 A | 2/2009 |
| WO | 2008/013170 A1 | 1/2008 |

\* cited by examiner

CIRCUIT BOARD AND CIRCUIT MODULE

This application is a continuation of International Application No. PCT/JP2015/067866 filed on Jun. 22, 2015 which claims priority from Japanese Patent Application No. 2014-131187 filed on Jun. 26, 2014. The contents of these applications are incorporated herein by reference in their entireties.

BACKGROUND

Technical Field

The present disclosure relates to techniques for a circuit board and a circuit module using the circuit board.

An increasing number of recent wireless communication devices employ plural types of wireless communication systems in a combined manner with intent to stably perform transmission and reception of signals. As one example of those wireless communication devices, a wireless communication device is disclosed in, e.g., Japanese Unexamined Patent Application Publication No. 2006-108908 (Patent Document 1).

Figure 13:
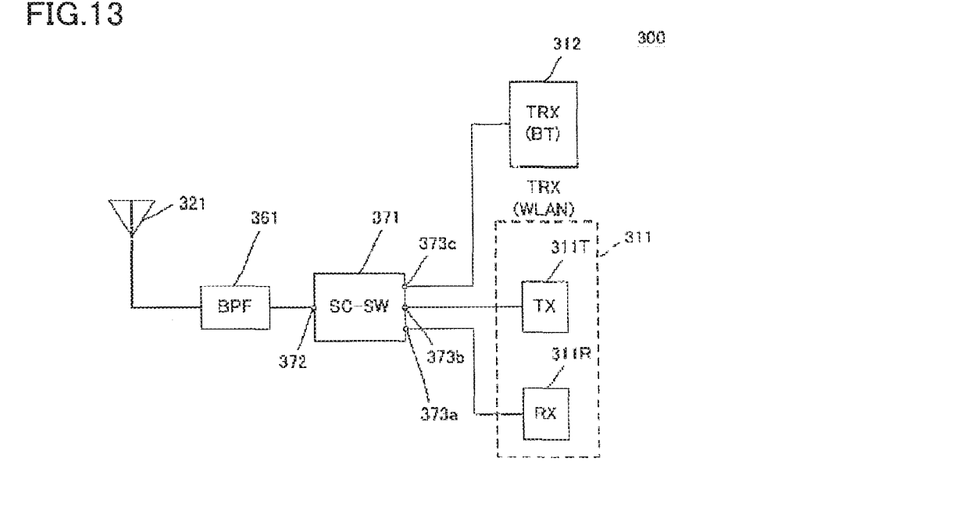
FIG. 13 is a circuit diagram illustrating a configuration of a wireless communication device 300 that represents background art.

FIG. 13 is a circuit diagram illustrating a configuration of a wireless communication device 300 disclosed in Japanese Unexamined Patent Application Publication No. 2006-108908. The wireless communication device 300 employs Bluetooth (registered trademark, hereinafter called "BT") and wireless LAN (hereinafter called "WLAN"), which are wireless communication systems utilizing radio waves in the same 2.4 GHz band, in a combined manner.

In the wireless communication device 300 illustrated in FIG. 13, the above-mentioned two wireless communication systems share one antenna 321. A transmitter/receiver 311 for WLAN and a transmitter/receiver 312 for BT are connected to the antenna 321 in parallel through a band pass filter 361 and a switch 371.

The switch 371 has an antenna side terminal 372, a first transmitter/receiver side terminal 373a, a second transmitter/receiver side terminal 373b, and a third transmitter/receiver side terminal 373c. The switch 371 is constituted to be able to change over connection between each of the first transmitter/receiver side terminal 373a, the second transmitter/receiver side terminal 373b, and the third transmitter/receiver side terminal 373c and the antenna side terminal 372.

In addition, the antenna side terminal 372 is connected to the band pass filter 361. The first transmitter/receiver side terminal 373a is connected to a receiver 311R for WLAN. The second transmitter/receiver side terminal 373b is connected to a transmitter 311T for WLAN. The third transmitter/receiver side terminal 373c is connected to the transmitter/receiver 312 for BT.

In the wireless communication device 300, when a signal is received through WLAN, the switch 371 is set to a first changeover state in which the antenna side terminal 372 and the first transmitter/receiver side terminal 373a are connected to each other. On the other hand, when a signal is transmitted through WLAN, the switch 371 is set to a second changeover state in which the antenna side terminal 372 and the second transmitter/receiver side terminal 373b are connected to each other. When a signal is transmitted or received through BT, the switch 371 is set to a third changeover state in which the antenna side terminal 372 and the third transmitter/receiver side terminal 373c are connected to each other.

Thus, in the wireless communication device 300, signals can be transmitted and received in the two types of wireless communication systems with use of the one antenna 321 by selectively changing over the switch 371 from one to another among the predetermined states.

Patent Document 1: Japanese Unexamined Patent Application Publication No. 2006-108908

BRIEF SUMMARY

Car-mounted information devices, such as a car audio system and a car navigation system, are different in price and function depending on the grades of cars. For example, a car-mounted information device for a high-class car employs an additional wireless communication system utilizing a different frequency band in some cases, as described later.

In the above-mentioned case, the changeover of the wireless communication systems with the switch disclosed in Japanese Unexamined Patent Application Publication No. 2006-108908 is not sufficient to be adapted for the situation. It is hence required to employ a circuit module that further includes a diplexer capable of changing over the wireless communication systems depending on the frequency bands.

However, design concepts of wireless communication devices are different in many cases among car makers and makers of the wireless communication devices. Therefore, demands for configurations of antennas and circuit modules are changed for each of those makers.

Meanwhile, in the field of circuit design, the so-called platforming technique of first designing common portions and then applying the common portions to design of various products has been progressed instead of the technique of individually designing all components of various products. In many cases, however, it is still prevail to perform final circuit design for each of individual products while the platforming technique is employed to meet the demands for the function and the manufacturing cost.

Particularly, car-mounted information devices, such as a car audio system and a car navigation system, are different in price and function depending on the grades of cars. Thus, wireless communication devices are often demanded to be designed in different circuit configurations depending on the grades of cars.

On the other hand, when different circuits are designed one to another in response to the demands, the number of types of circuit boards necessary to realize the designed circuits in the form of individual modules is increased. As a result, a long time is taken to develop and commercialize various types of circuit boards as products one by one. Furthermore, as the number of types of the circuit boards to be manufactured as the products increases, a difficulty in manufacturing and managing the circuit boards also increases.

Thus, although the platforming technique has been progressed, it is hard to say that the concept of the platforming technique is sufficiently converted into reality.

In addition, wireless communication devices mounted on cars are required to have higher reliability than those used for household purposes. Therefore, man-hours needed to evaluate reliability of components of the car-mounted wireless communication device are increased in many cases. For that reason, a lot of labor and time are necessary to carry out evaluation of reliability for various types of circuit modules, which include different circuit boards, one by one. That point has impeded a process of efficiently promoting development of the circuit modules.

In view of the situations described above, the present disclosure provides a circuit board that is able to efficiently progress development of a circuit module for use in changing over wireless communication systems, and that is easy to manufacture and to manage. The present disclosure provides a circuit module using the circuit board.

The present disclosure achieves improvements in a circuit board and a circuit module using the circuit board.

First, the present disclosure is addressed to a circuit board.

A first embodiment of the circuit board according to the present disclosure includes a board base element, a communication circuit connection terminal, an antenna connection terminal, and a circuit pattern in which predetermined circuit elements are mountable.

The communication circuit connection terminal includes first and second communication circuit connection terminals to which are connected respectively communication circuits in first and second wireless communication systems utilizing different radio frequency bands.

Here, the communication circuits in the wireless communication systems imply a transmission circuit, a reception circuit, and a transmission/reception circuit with respect to signals that are used to operate the wireless communication systems. Those communication circuits may be incorporated in one IC. Alternatively, those communication circuits may be implemented in the form of ICs that are independent of one another for each circuit. When the communication circuits are implemented in the form of one or more ICs, the circuit board according to the present disclosure may be designed to be able to mount the IC(s) thereon. On the other hand, the communication circuits may be constituted individually by predetermined electronic components in communication devices that are independent of one another for each circuit.

The antenna connection terminal includes first and second antenna connection terminals to which the first and second antennas are connectable respectively.

The predetermined circuit elements include optional elements that are electronic components to be mounted or not to be mounted in the circuit pattern depending on whether the second antenna is connected to the second antenna connection terminal, and basic elements that are electronic components to be mounted in the circuit pattern regardless of whether the optional elements are mounted.

The optional elements include one of a first capacitor and a first coil, and a second capacitor. The basic elements include the other of the first capacitor and the first coil, and first and second filters.

The circuit pattern allows the predetermined circuit elements to be mounted therein such that one of the following two configurations is formed.

The second antenna is not connected to the second antenna connection terminal. Furthermore, the one of the first capacitor and the first coil among the optional elements, the second capacitor, and the basic elements are mounted in the circuit pattern. Moreover, the remaining optional elements are not mounted in the circuit pattern. In this case, the first and second communication circuit connection terminals are connected to the first antenna connection terminal through a diplexer circuit that includes the first and second capacitors, the first coil, and the first and second filters. In such a configuration, communication is performed by the first and second wireless communication systems.

Here, the diplexer circuit in the first embodiment is to change over a connection target of the first antenna to either one of the communication circuits in the first and second wireless communication systems.

As an alternative, the second antenna is connected to the second antenna connection terminal. Furthermore, the one of the first capacitor and the first coil among the optional elements, and the second capacitor are not mounted in the circuit pattern. Moreover, the remaining optional elements and the basic elements are mounted in the circuit pattern. In this case, the first communication circuit connection terminal and the first antenna connection terminal are connected through the first filter, and the second communication circuit connection terminal and the second antenna connection terminal are connected through the second filter. In such a configuration, communication is performed by the first and second wireless communication systems.

Stated in another way, the optional elements in the present disclosure are circuit elements including electronic components that change over paths through which the predetermined communication circuit connection terminals are to be connected to the antenna connection terminal(s), depending on whether one or more among the optional elements are mounted. The electronic components for changing over the paths further serve as a part of the diplexer circuit and contribute to changing over the radio frequency band to be used.

The first embodiment of the circuit board according to the present disclosure corresponds to the case where the second wireless communication system is, for example, a so-called SISO (Single-Input and Single-Output) system.

The first embodiment shows that a common circuit board can be adapted for plural types of antenna configurations that are conceivable, as described above, with respect to the first and second wireless communication systems utilizing different radio frequency bands.

Accordingly, even when a demand for the antenna configuration is changed in circuit design, it is not required to increase the number of types of circuit boards in order to realize individual designed circuits in the form of modules. As a result, a long time is not taken to develop and commercialize various types of circuit boards as products. Furthermore, as the number of types of the circuit boards to be manufactured as the products does not increase, it is relatively easy to manufacture and manage the circuit boards.

Moreover, the circuit configuration can be changed just by changing a manner of mounting the optional elements in one type of common circuit board.

In addition, many of items for reliability evaluation can be shared in tests of the circuit modules formed on the individual common circuit boards. As a result, labor and time required to perform the reliability test for each of the circuit modules can be reduced.

Hence, development, setups for commercialization, and manufacturing of the circuit modules can be progressed efficiently by employing the circuit board of the present disclosure.

A second embodiment of the circuit board according to the present disclosure corresponds to the case where, in the above-described first embodiment, the second wireless communication system performs communications of signals through a plurality of paths including first and second paths.

Thus, the communication circuit in the second wireless communication system includes communication circuits in the first and second paths. The second communication circuit connection terminal includes communication circuit connection terminals in the first and second paths, which communication circuit connection terminals are connected respectively to the communication circuits in the first and second paths.

The antenna connection terminal further includes a third antenna connection terminal to which a third antenna is connected. The basic elements among the predetermined circuit elements further include a third filter.

The circuit pattern is formed to have one of the following two configurations.

The second antenna is not connected to the second antenna connection terminal. Furthermore, the one of the first capacitor and the first coil among the optional elements, the second capacitor, and the basic elements are mounted in the circuit pattern. Moreover, the remaining optional elements are not mounted in the circuit pattern. In this case, the first communication circuit connection terminal and the communication circuit connection terminal in the first path are connected to the first antenna connection terminal through a diplexer circuit that includes the first and second capacitors, the first coil, and the first and second filters, and the communication circuit connection terminal in the second path is connected to the third antenna connection terminal through the third filter. In such a configuration, communication is performed by the first and second wireless communication systems.

Here, the diplexer circuit in the second embodiment is to change over a connection target of the first antenna to either one of the communication circuit in the first wireless communication system and the communication circuit in the first path.

As an alternative, the second antenna is connected to the second antenna connection terminal. Furthermore, the one of the first capacitor and the first coil among the optional elements, and the second capacitor are not mounted in the circuit pattern. Moreover, the remaining optional elements and the basic elements are mounted in the circuit pattern. In this case, the first communication circuit connection terminal and the first antenna connection terminal are connected through the first filter, the communication circuit connection terminal in the first path and the second antenna connection terminal are connected through the second filter, and the communication circuit connection terminal in the second path and the third antenna connection terminal are connected through the third filter. In such a configuration, communication is performed by the first and second wireless communication systems.

The second embodiment of the circuit board according to the present disclosure corresponds to the case where the second wireless communication system is, for example, a so-called MIMO (Multiple-Input and Multiple-Output) system.

MIMO is a communication technique of, for example, dividing one data pipe through which wireless communication of signals at a high transfer rate is performed, into a plurality of data pipes, called streams, at a low transfer rate. With MIMO, wireless communications are preformed from individual antennas by employing radio waves in the same frequency band. It is hence possible to effectively utilize the occupied frequency band, and to increase a communication speed. The term "path" used in the present disclosure corresponds to the above-mentioned stream.

The second embodiment shows that one type of common circuit board can be adapted for plural types of antenna configurations that are conceivable in connection with the case where, as described above, the second wireless communication system performs communications of signals through a plurality of paths including the first and second paths.

Accordingly, even when there is possibly a demand for increasing a signal communication speed with MIMO, it is not required to increase the number of types of circuit boards.

In other words, the second embodiment can provide not only similar advantageous effects to those obtained in the above-mentioned case of SISO, but also adaptability for a high-quality wireless communication system.

The present disclosure is further addressed to a circuit module.

A first embodiment of the circuit module according to the present disclosure is a circuit module interposed between the first antenna and the communication circuits in the first and second wireless communication systems.

This circuit module is constituted as follows in the first embodiment of the circuit board according to the present disclosure. The second antenna is not connected to the second antenna connection terminal. Furthermore, the one of the first capacitor and the first coil among the optional elements, the second capacitor, and the basic elements are mounted in the circuit pattern. Moreover, the remaining optional elements are not mounted in the circuit pattern.

A second embodiment of the circuit module according to the present disclosure is a circuit module interposed between the first and second antennas and the communication circuits in the first and second wireless communication systems.

This circuit module is constituted as follows in the first embodiment of the circuit board according to the present disclosure. The second antenna is connected to the second antenna connection terminal. Furthermore, the one of the first capacitor and the first coil among the optional elements, and the second capacitor are not mounted in the circuit pattern. Moreover, the remaining optional elements and the basic elements are mounted in the circuit pattern.

A third embodiment of the circuit module according to the present disclosure is a circuit module interposed between the first and third antennas and the communication circuits in the first and second wireless communication systems.

This circuit module is constituted as follows in the second embodiment of the circuit board according to the present disclosure. The second antenna is not connected to the second antenna connection terminal. Furthermore, the one of the first capacitor and the first coil among the optional elements, the second capacitor, and the basic elements are mounted in the circuit pattern. Moreover, the remaining optional elements are not mounted in the circuit pattern.

A fourth embodiment of the circuit module according to the present disclosure is a circuit module interposed between the first to third antennas and the communication circuits in the first and second wireless communication systems.

This circuit module is constituted as follows in the second embodiment of the circuit board according to the present disclosure. The second antenna is connected to the second antenna connection terminal. Furthermore, the one of the first capacitor and the first coil among the optional elements, and the second capacitor are not mounted in the circuit pattern. Moreover, the remaining optional elements and the basic elements are mounted in the circuit pattern.

Thus, the first to fourth embodiments of the circuit module according to the present disclosure are circuit modules in which the predetermined circuit elements are mounted at the predetermined positions of the circuit pattern that is formed on the circuit board according to the present disclosure.

Accordingly, many of items for reliability evaluation can be shared in tests of the circuit modules formed on the individual common circuit boards. As a result, labor and time required to perform the reliability test for each of the circuit modules can be reduced.

Hence, development, setups for commercialization, and manufacturing of the circuit modules can be progressed efficiently.

According to the present disclosure, one type of common circuit board can be adapted for plural types of antenna configurations depending on whether one or more electronic components as the optional elements are mounted, the antenna configurations being conceivable with respect to the first and second wireless communication systems that utilize different radio frequency bands.

Since the circuit modules according to the present disclosure are formed on the individual common circuit boards, many of items for reliability evaluation can be shared in tests of those circuit modules. As a result, labor and time required to perform the reliability test for each of the circuit modules can be reduced.

Hence, development, setups for commercialization, and manufacturing of the circuit modules can be progressed efficiently by employing the circuit board according to the present disclosure.

DETAILED DESCRIPTION

Features of the present disclosure will be described in more detail below in connection with embodiments of the present disclosure.

In car-mounted wireless communication devices, not only WLAN and BT in a 2.4 GHz band, but also WLAN in a 5 GHz band in which radio frequency interference is less apt to occur and stable communication can be performed have been used in a gradually increasing number.

In a wireless communication device including three wireless communication systems of WLAN in the 5 GHz, WLAN in the 2.4 GHz band, and BT in the 2.4 GHz band, four kinds of antenna configurations are conceivable as illustrated in FIGS. 14A-14D, for example.

Figure 14A:
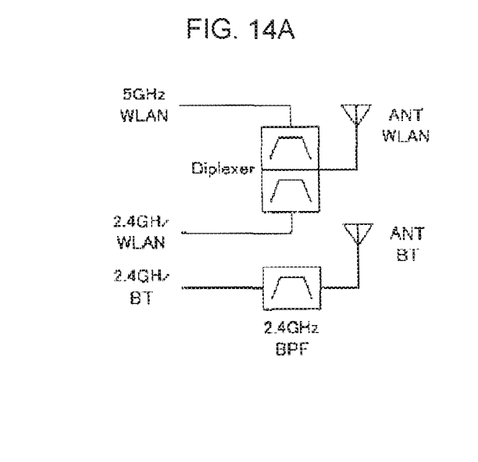
FIGS. 14A-14D are schematic views referenced to explain antenna configurations that are conceivable in a wireless communication device including three wireless communication systems for WLAN in a 2.4 GHz band, WLAN in a 5 GHz band, and BT in a 2.4 GHz band.

FIG. 14A illustrates a configuration in which, of the above three communication systems, WLANs in the two frequency bands share one antenna, and BT employs another antenna. In this case, selection of the radio frequency band employed by each WLAN is performed with provision of a diplexer.

Figure 14B:
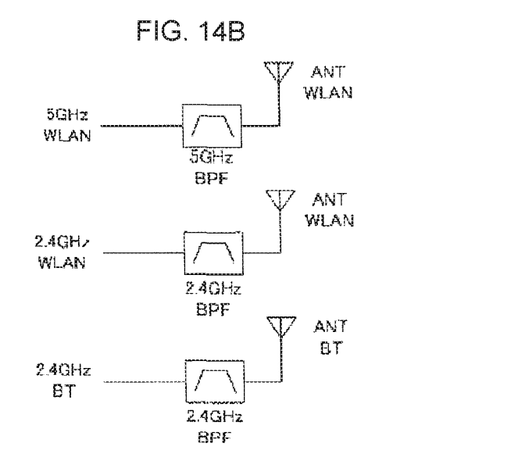

FIG. 14B illustrates a configuration in which the above three communication systems employ antennas different from one another.

Figure 14C:
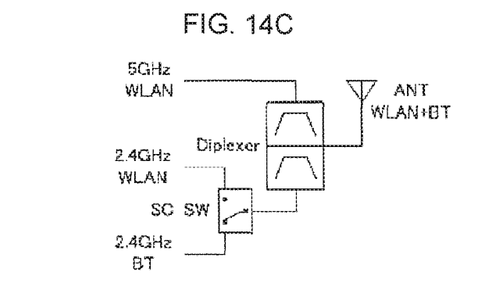

FIG. 14C illustrates a configuration in which all the above three communication systems share one antenna. In this case, selection of the radio frequency band to be used is performed with provision of a diplexer. Selection between WLAN and BT in the 2.4 GHz band is made by changing over a switch.

Figure 14D:
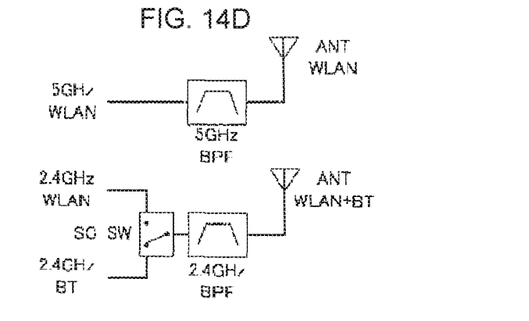

FIG. 14D illustrates a configuration in which, of the above three communication systems, WLAN and BT in the same 2.4 GHz band share one antenna and WLAN in the 5 GHz band employs another antenna. In this case, selection between WLAN and BT in the 2.4 GHz band is made by changing over a switch.

As described above, in the wireless communication device including a plurality of wireless communication systems, various antenna configurations are conceivable depending on combinations of the radio frequency band and the wireless communication system to be utilized.

Embodiments of the present disclosure will be described below in connection with, as a practical example, a circuit board that is adaptable for the four kinds of relations, illustrated in FIGS. 14A-14D, between the wireless communication systems and the antenna configurations. It is to be noted that, of the wireless communication systems illustrated in FIGS. 14A-14D, WLAN in the 5 GHz band corresponds to a first wireless communication system in the present disclosure, and that WLAN in the 2.4 GHz band corresponds to a second wireless communication system in the present disclosure.

Furthermore, in the following description, WLAN in the 5 GHz band is simply called "5 G WLAN", WLAN in the 2.4 GHz band is simply called "2.4 G WLAN", and BT in the 2.4 GHz band is simply called "2.4 G BT".

—First Embodiment of Circuit Board—

A circuit board 110 according to a first embodiment of the present disclosure includes a board base element B, a communication circuit connection terminal T10, an antenna connection terminal T20, and a circuit pattern P in which predetermined circuit elements are mountable. The circuit board 110 according to the first embodiment of the present disclosure is described with reference to FIGS. 1 and 2.

Figure 1:
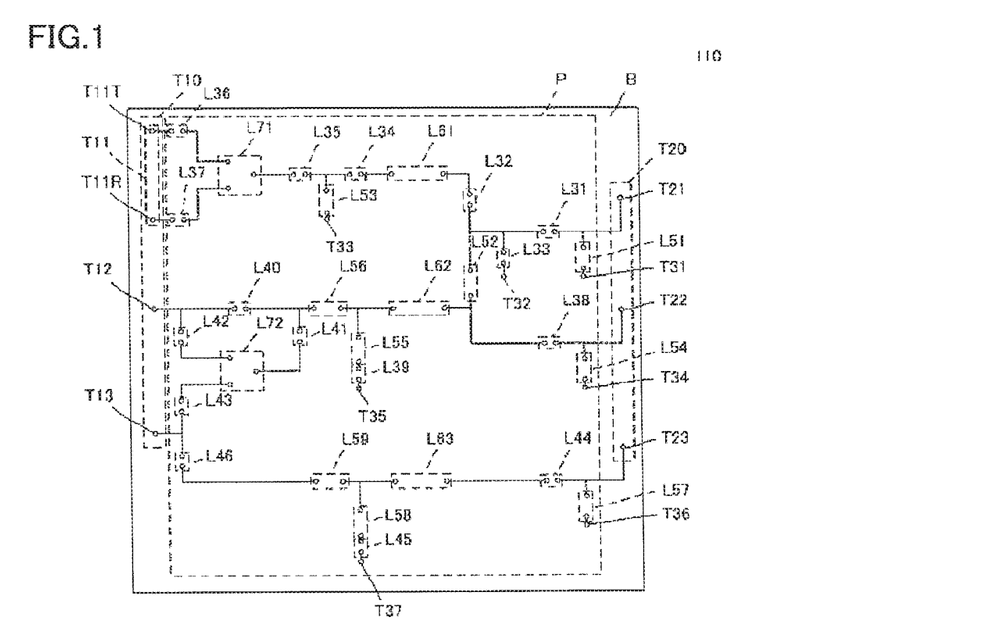
FIG. 1 is a plan view of a circuit board 110 according to a first embodiment of the present disclosure.
Figure 2:
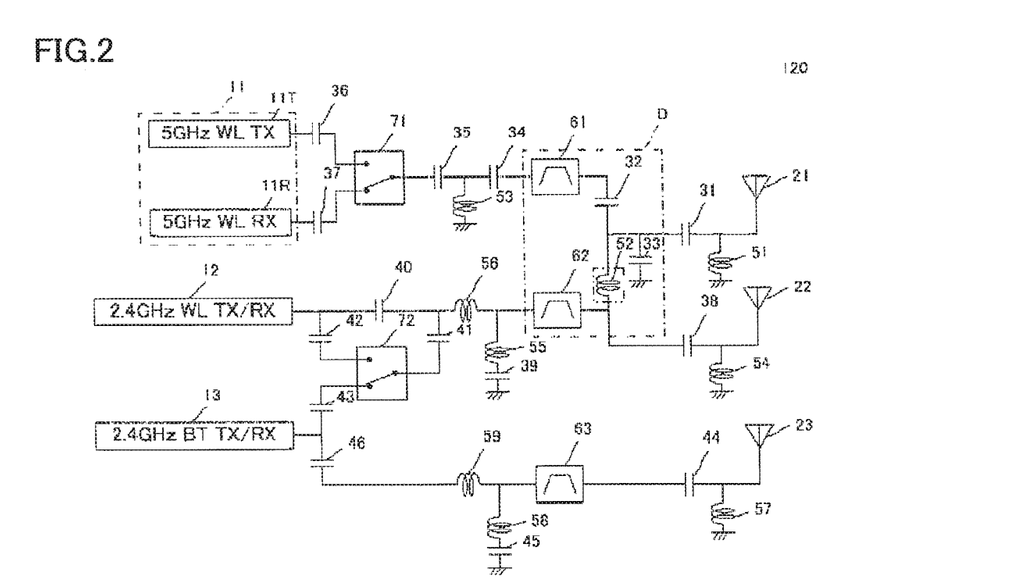
FIG. 2 is a circuit diagram illustrating a configuration of a virtual circuit module 120, the circuit diagram being referenced to explain communication circuits and antennas that may be connected to connection terminals in the circuit board 110 illustrated in FIG. 1, and circuit elements that can be mounted at predetermined positions in a circuit pattern P in the circuit board 110.

FIG. 1 is a plan view of the circuit board 110 according to the first embodiment of the present disclosure. FIG. 2 is a circuit diagram illustrating a configuration of a virtual circuit module 120 in which all communication circuits and antennas are connected and all circuit elements are mounted in the circuit board 110 illustrated in FIG. 1.

The circuit module 120 is illustrated with intent to explain the communication circuits and the antennas that may be connected to the connection terminals, and the circuit elements that can be mounted at predetermined positions in a circuit pattern P. Thus, the circuit module 120 is different from an actual circuit module. In the actual circuit module, as described later, the circuit element to be mounted is changed depending on whether a second antenna 22 is connected to a second antenna connection terminal T22.

<Board Base Element>

The circuit board 110 includes the board base element B. In the first embodiment, the board base element B has a rectangular shape. A ceramic material such as alumina, or a composite material obtained by solidifying epoxy resin with glass fibers can be used as a material of the board base element B.

<Communication Circuit Connection Terminals>

The communication circuit connection terminal T10 includes first to third communication circuit connection terminals T11, T12 and T13. A communication circuit 11 for 5 G WLAN, a communication circuit 12 for 2.4 G WLAN, and a communication circuit 13 for 2.4 G BT are connected to the first to third communication circuit connection terminals T11, T12 and T13, respectively.

In this embodiment, a transmission circuit 11T and a reception circuit 11R are separate from each other in the communication circuit 11 for 5 G WLAN. Therefore, the first communication circuit connection terminal T11 is constituted in the form including a connection terminal T11T to which the transmission circuit 11T is connected, and a connection terminal T11R to which the reception circuit 11R is connected. In FIG. 1, the communication circuit connection terminals are each denoted by a white circle.

In the first embodiment, the communication circuit connection terminal T10 is formed on an upper surface of the board base element B near one side thereof.

<Antenna Connection Terminals>

The antenna connection terminal T20 is constituted in the form including first to third antenna connection terminals T21, T22 and T23 to which first to third antennas 21, 22 and 23 can be connected, respectively. In FIG. 1, the antenna connection terminals are each denoted by a white circle.

In the first embodiment, the antenna connection terminal T20 is formed on the upper surface of the board base element B. More specifically, the antenna connection terminal T20 is formed near one of sides of the board base element B, the one side opposing to the side near which the communication circuit connection terminal T10 is formed.

<Circuit Elements>

Circuit elements, which can be mounted in the circuit pattern P illustrated in FIG. 1, include capacitors 31 to 46, coils 51 to 59, filters 61 to 63, and switches 71 and 72, as illustrated in FIG. 2.

In the first embodiment, particularly, electronic components in relation to connection paths between the first and second communication circuit connection terminals T11, T12 and the first and second antenna connection terminals T21, T22 are assumed to be the predetermined circuit elements.

Stated in another way, electronic components necessary for circuit modules to be adapted for two types of antenna configurations, which are conceivable with respect to 5 G. WLAN and 2.4 G. WLAN, are regarded as the predetermined circuit elements in the first embodiment.

From the above-mentioned point of view, the predetermined circuit elements, which can be mounted in the circuit pattern P on the circuit board 110 according to the first embodiment, include optional elements and basic elements.

The optional elements are electronic components that are to be mounted or not to be mounted in the circuit pattern P depending on whether the second antenna 22 is connected to the second antenna connection terminal T22.

The basic elements are electronic components that are to be mounted in the circuit pattern P regardless of whether the optional elements are mounted. In the first embodiment, the basic elements include electronic components to make communication feasible through 5 G WLAN. The basic elements further include electronic components to make communication feasible through 2.4 G WLAN in cooperation with the optional elements.

More specifically, when 2.4 G WLAN and 2.4 G BT are not changed over by the switch 72 and 2.4 G BT performs communication with use of the third antenna 23, the capacitors 33 and 38 and the coils 52 and 54 correspond to the optional elements. The capacitors 31, 32, 34 to 37, 39 and 40, the coils 51, 53, 55 and 56, the filters 61 and 62, and a switch 71 correspond to the basic elements.

On the other hand, when 2.4 G WLAN and 2.4 G BT are changed over by the switch 72 and 2.4 G BT performs communication without necessarily using the third antenna 23, the capacitors 33 and 38 and the coils 52 and 54 correspond to the optional elements. The capacitors 31, 32, 34 to 37, 39, 41 and 42, the coils 51, 53, 55 and 56, the filters 61 and 62, and the switches 71 and 72 correspond to the basic elements.

It is to be noted that, in the virtual circuit module 120 illustrated in FIG. 2, the capacitors 32 and 33 correspond to first and second capacitors in the present disclosure, respectively, and the coil 52 corresponds to a first coil in the present disclosure.

<Circuit Pattern>

As illustrated in FIG. 1, a circuit pattern is formed on the upper surface of the board base element B of the circuit board 110, the circuit pattern including lands to which the electronic components of the virtual circuit module 120 illustrated in FIG. 2 can be mounted, and wires connecting the lands.

In FIG. 1, the lands are each denoted by two white circles both surrounded by a dotted line, those two white circles being drawn at a position corresponding to each of the circuit elements illustrated in FIG. 2. Moreover, the lands are each denoted by affixing L to the symbol of the corresponding circuit element. Ground terminals T31 to T37 are each denoted by a white circle.

The above-mentioned circuit pattern is formed in accordance with circuit design described below.

First, the case that the communication circuit 13 for 2.4 G BT is independently connected to the third antenna 23 without necessarily using any antenna in common to the communication circuit 11 for 5 G WLAN and the communication circuit 12 for 2.4 G WLAN. In other words, a circuit including capacitors 44 to 46, coils 57 to 59, and a filter 63 is designed to allow a signal for 2.4 G BT to pass therethrough is considered (first premise).

The following case is considered on condition of the first premise (see FIG. 7 described later). The second antenna 22 is not connected to the second antenna connection terminal T22. Furthermore, the first coil 52 and the second capacitor 33 among the optional elements, and the basic elements are mounted in the circuit pattern P. Moreover, the remaining optional elements, i.e., the capacitor 38 and the coil 54, are not mounted in the circuit pattern P.

In the above case, the circuit pattern P is designed such that the first and second communication circuit connection terminals T11 and T12 are connected to the first antenna connection terminal T21 through a diplexer circuit D (circuit surrounded by a one-dot-chain line) in order to perform communication through 5 G. WLAN and 2.4 G. WLAN (pattern P-A). The diplexer circuit D includes the first and second capacitors 32 and 33, the first coil 52, and the first and second filters 61 and 62.

More specifically, a circuit including the capacitors 31 to 37, the coils 51 and 53, the filter 61, and the switch 71 is designed to allow a signal for 5 G WLAN to pass therethrough. A circuit including the capacitors 31, 33, 39 and 40, the coils 51, 52, 55 and 56, and the filter 62 is designed to allow a signal for 2.4 G WLAN to pass therethrough.

Here, the capacitor 31 and the coil 51 form an ESD protective circuit for dropping a surge down to the ground. The capacitors 34 and 35 and the coil 53 form a high-pass matching circuit allowing a signal in the 5 GHz band to pass therethrough. The capacitor 39 and the coil 55 form a trap circuit for dropping a noise signal down to the ground. The capacitor 40 and the coil 56 form a low-pass matching circuit allowing a signal in the 2.4 GHz band to pass therethrough. The capacitors 36 and 37 serve as coupling capacitors for DC cutting.

The diplexer circuit D changes over a connection target of the first antenna 21 to one of the communication circuit 11 for 5 G WLAN and the communication circuit 12 for 2.4 G WLAN.

It is hence understood that the pattern P-A formed on the circuit board 110 implements the relation, illustrated in FIG. 14A, between the wireless communication systems and the antenna configuration.

The following case is considered on condition of the first premise (see FIG. 8 described later). The second antenna 22 is connected to the second antenna connection terminal T22. Furthermore, the first coil 52 and the second capacitor 33 among the optional elements are not mounted in the circuit pattern P. Moreover, the remaining optional elements, i.e., the capacitor 38 and the coil 54, and the basic elements are mounted in the circuit pattern P.

In the above case, the first communication circuit connection terminal T11 and the first antenna connection terminal T21 are connected through the first filter 61. Furthermore, the second communication circuit connection terminal T12 and the second antenna connection terminal T22 are connected through the second filter 62. Thus, the circuit pattern P is designed into a configuration adapted for performing communication through 5 G WLAN and 2.4 G WLAN (pattern P-B).

As seen from comparing the pattern P-A and the pattern P-B, the paths through which the first and second communication circuit connection terminals T11, T12 are to be connected to the antenna connection terminal(s) are changed over depending on whether the first coil 52 (circuit element surrounded by a two-dot-chain line) is mounted to the land L52.

More specifically, when the first coil 52 is not mounted, a circuit including the capacitors 31, 32 and 34 to 37, the coils 51 and 53, the filter 61, and the switch 71 is designed to allow the signal for 5 G WLAN to pass therethrough. A circuit including the capacitors 38 to 40, the coils 54 to 56, and the filter 62 is designed to allow the signal for 2.4 G WLAN to pass therethrough.

Here, the capacitor 38 and the coil 54 form an ESD protective circuit for dropping a surge down to the ground. Description of circuits common to those in the pattern P-A is not repeated.

It is hence understood that the pattern P-B formed on the circuit board 110 implements the relation, illustrated in FIG. 14B, between the wireless communication systems and the antenna configuration.

Next, the case that the communication circuit 13 for 2.4 G BT uses an antenna in common to at least one of the communication circuit 11 for 5 G WLAN and the communication circuit 12 for 2.4 G WLAN, and that the third communication circuit connection terminal T13 is connected to one of the first antenna connection terminal T21 and the second antenna connection terminal T22 is considered.

More specifically, the third antenna 23 is not connected to the third antenna connection terminal T23. The signal for 2.4 G BT passes, with changeover of the switch 72, through the same circuit as the above-described circuit through which the signal for 2.4 WLAN passes. Thus, the capacitors 44 to 46, the coils 57 to 59, and the filter 63 are not mounted in the circuit pattern P (second premise).

the following case is considered on condition of the second premise (see FIG. 9 described later). As in the pattern P-A, the second antenna 22 is not connected to the second antenna connection terminal T22. Furthermore, the first coil 52 and the second capacitor 33 among the optional elements, and the basic elements are mounted in the circuit pattern P. Moreover, the remaining optional elements, i.e., the capacitor 38 and the coil 54, are not mounted in the circuit pattern.

In the above case, the circuit pattern P is designed such that the first to third communication circuit connection terminals T11 to T13 are connected to the first antenna connection terminal T21 through a diplexer circuit D, as in the pattern P-A, in order to perform communication through 5 G WLAN, 2.4 G WLAN, and 2.4 G BT (pattern P-C). The diplexer circuit D includes the first and second capacitors 32 and 33, the first coil 52, and the first and second filters 61 and 62.

More specifically, a circuit including the capacitors 31 to 37, the coils 51 and 53, the filter 61, and the switch 71 is designed to allow the signal for 5 G WLAN to pass therethrough. A circuit including the capacitors 31, 33, 39, 41 and 42, the coils 51, 52, 55 and 56, the filter 62, and the switch 72 is designed to allow the signal for 2.4 G WLAN to pass therethrough. A circuit including the capacitors 31, 33, 39, 41 and 43, the coils 51, 52, 55 and 56, the filter 62, and the switch 72 is designed to allow the signal for 2.4 G BT to pass therethrough.

Here, the capacitors 42 and 43 serve as coupling capacitors for DC cutting. Description of circuits common to those in the pattern P-A is not repeated.

It is hence understood that the pattern P-C formed on the circuit board 110 implements the relation, illustrated in FIG. 14C, between the wireless communication systems and the antenna configuration.

The following case is considered on condition of the second premise (see FIG. 10 described later). As in the pattern P-B, the second antenna 22 is connected to the second antenna connection terminal T22. Furthermore, the first coil 52 and the second capacitor 33 among the optional elements are not mounted in the circuit pattern P. Moreover, the remaining optional elements, i.e., the capacitor 38 and the coil 54, and the basic elements are mounted in the circuit pattern P.

In the above case, the first communication circuit connection terminal T11 and the first antenna connection terminal T21 are connected through the first filter 61 as in the pattern P-B. Furthermore, the second communication circuit connection terminal T12 and the second antenna connection terminal T22 are connected through the second filter 62. Moreover, the third communication circuit connection terminal T13 and the second antenna connection terminal T22 are connected similarly through the second filter 62. Thus, the circuit pattern P is designed into a configuration adapted for performing communication through 5 G WLAN, 2.4 G WLAN, and 2.4 G BT (pattern P-D).

As seen from comparing the pattern P-C and the pattern P-D, the paths through which the first to third communication circuit connection terminals T11 to T13 are to be connected to the antenna connection terminal(s) are changed over depending on whether the first coil 52 (circuit element surrounded by a two-dot-chain line) is mounted to the land L52.

More specifically, when the first coil 52 is not mounted, a circuit including the capacitors 31, 32 and 34 to 37, the coils 51 and 53, the filter 61, and the switch 71 is designed to allow the signal for 5 G WLAN to pass therethrough. A circuit including the capacitors 38, 39, 41 and 42, the coils 54 to 56, the filter 62, and the switch 72 is designed to allow the signal for 2.4 G WLAN to pass therethrough. A circuit including the capacitors 38, 39, 41 and 43, the coils 54 to 56, the filter 62, and the switch 72 is designed to allow the signal for 2.4 G BT to pass therethrough.

Description of circuits common to those in the patterns P-B and P-C is not repeated.

It is hence understood that the pattern P-D formed on the circuit board 110 implements the relation, illustrated in FIG. 14D, between the wireless communication systems and the antenna configuration.

As seen from the above discussion, the circuit pattern P on the circuit board 110, illustrated in FIG. 1, is adaptable for the four types of relations, illustrated in FIGS. 14A-14D, between the wireless communication systems and the antenna configurations.

In other words, with use of the circuit board 110 according to the first embodiment of the present disclosure, even when a demand for the antenna configuration is changed in circuit design, it is not required to increase the number of types of circuit boards in order to realize individual designed circuits in the form of modules. Hence development, setups for commercialization, and manufacturing of the circuit modules can be progressed efficiently.

Figure 7:
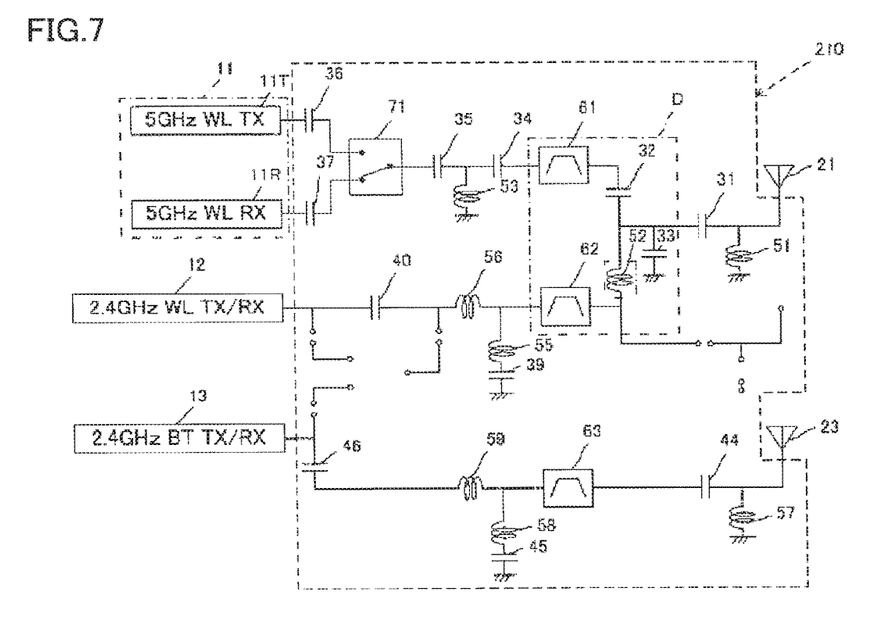
FIG. 7 is a circuit diagram illustrating a configuration of a circuit module 210 according to the first embodiment of the present disclosure.
Figure 9:
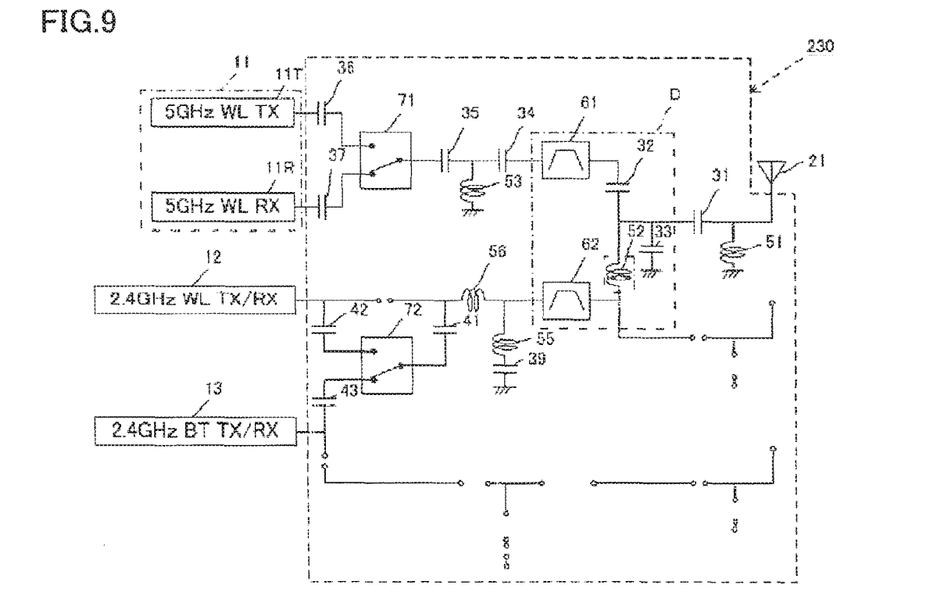
FIG. 9 is a circuit diagram illustrating a configuration of a principal portion of a circuit module 230 according to a third embodiment of the present disclosure.

Furthermore, in the circuit board 110 according to the first embodiment of the present disclosure, as illustrated in FIGS. 7 and 9 described later, the first coil 52 and the second capacitor 33 among the optional elements are mounted in the circuit pattern P. With the mounting of those optional elements, the second communication circuit connection terminal T12 is connected to the first antenna connection terminal T21, and the diplexer circuit D is formed at the same time.

In other words, just by mounting the predetermined electronic components among the optional elements, it is possible not only to change over the paths through which the communication circuit connection terminals are to be connected to the antenna connection terminal, but also to form the diplexer circuit D that changes over the radio frequency band to be utilized in the communication.

—Modification of First Embodiment of Circuit Board—

A modification 130 of the circuit board 110 according to the first embodiment of the present disclosure will be described below with reference to FIGS. 3 and 4.

Figure 3:
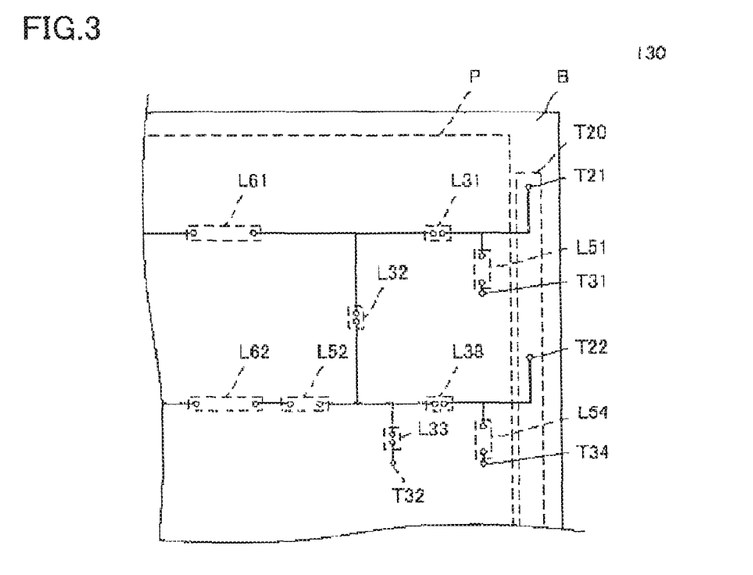
FIG. 3 is a plan view of a principal portion of a modification 130 of the circuit board 110 according to the first embodiment of the present disclosure.

FIG. 3 is a plan view of a principal portion of the modification 130 of the circuit board 110 according to the first embodiment of the present disclosure. FIG. 4 is a circuit diagram illustrating a configuration of a principal portion of a virtual circuit module 140 in which all communication circuits and all antennas are connected and all circuit elements are mounted in the modification 130 of the circuit board 110 illustrated in FIG. 3.

Figure 4:
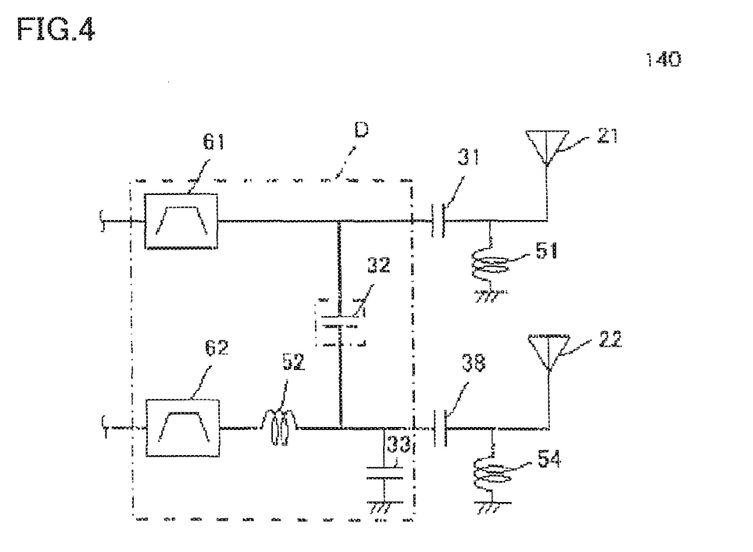
FIG. 4 is a circuit diagram illustrating a configuration of a principal portion of a virtual circuit module 140, the circuit diagram being referenced to explain communication circuits and antennas that may be connected to connection terminals in the modification 130 of the circuit board 110 illustrated in FIG. 3, and circuit elements that can be mounted at predetermined positions in the circuit pattern P in the modification 130.

Similarly to the circuit module 120 of FIG. 2, the circuit module 140 of FIG. 4 is referenced to explain communication circuits and antennas that can be connected to connection terminals, and circuit elements that can be mounted in a circuit pattern. Thus, the circuit module 140 is different from an actual circuit module.

In the circuit board 110 according to the first embodiment of the present disclosure, the paths through which the first and second communication circuit connection terminals T11 and T12 are to be connected to the antenna connection terminal(s) are changed over depending on whether the first coil 52 among the optional elements is mounted.

On the other hand, in the modification 130 of the circuit board 110, the paths through which the first and second communication circuit connection terminals T11 and T12 are to be connected to the antenna connection terminal(s) are changed over depending on whether the first capacitor 32 among the optional elements is mounted to the land L32.

In that case, the first capacitor 32 serves as a part of the diplexer circuit D for changing over the connection target of the first antenna 21 to one of the communication circuit 11 for 5 G WLAN and the communication circuit 11, 12 for 2.4 G WLAN. As described above, the diplexer circuit D includes the first and second capacitors 32 and 33, the first coil 52, and the first and second filters 61 and 62.

—Second Embodiment of Circuit Board—

A circuit board 150 according to a second embodiment of the present disclosure will be described below with reference to FIGS. 5 and 6.

Figure 5:
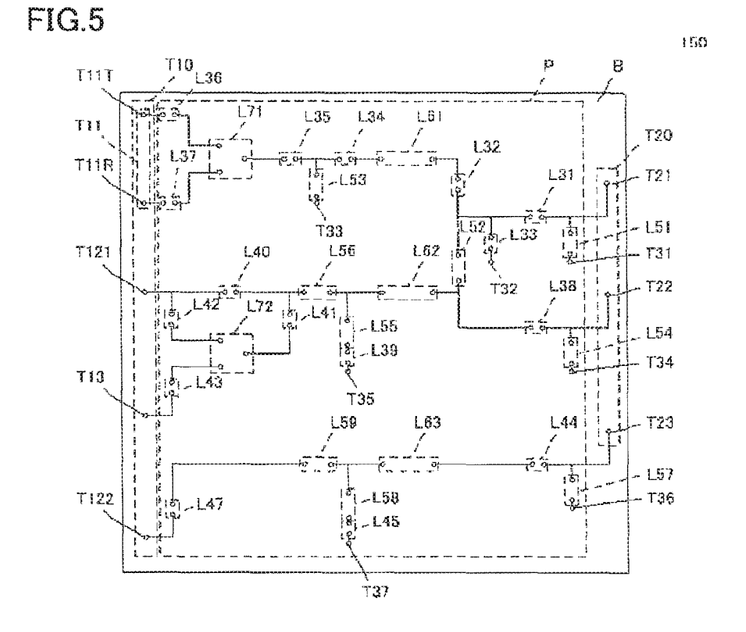
FIG. 5 is a plan view of a circuit board 150 according to a second embodiment of the present disclosure.

FIG. 5 is a plan view of the circuit board 150 according to the second embodiment of the present disclosure. FIG. 6 is a circuit diagram illustrating a configuration of a virtual circuit module 160 in which all communication circuits and all antennas are connected and all circuit elements are mounted in the circuit board 150 illustrated in FIG. 5.

Figure 6:
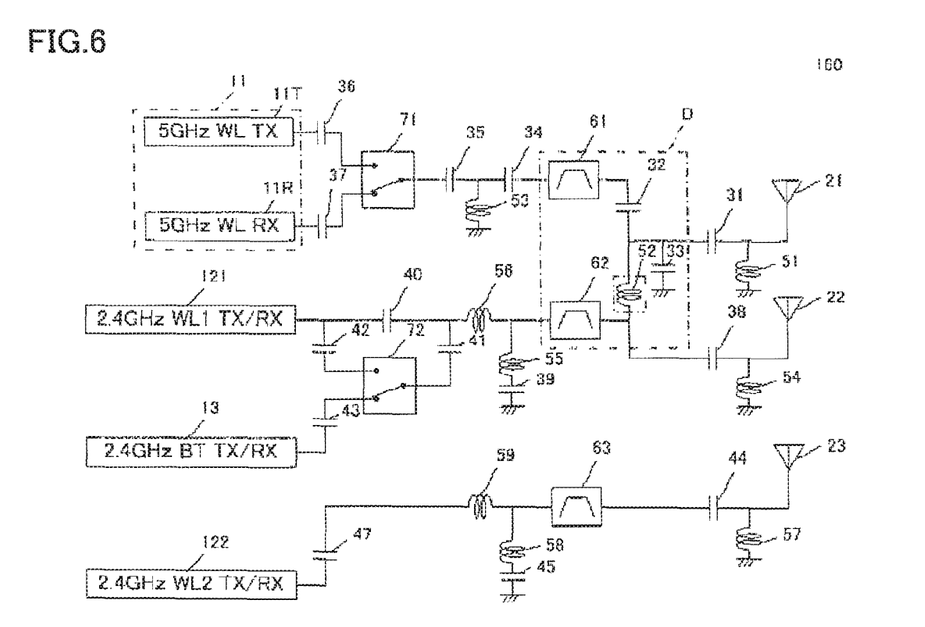
FIG. 6 is a circuit diagram illustrating a configuration of a virtual circuit module 160, the circuit diagram being referenced to explain communication circuits and antennas that may be connected to connection terminals in the circuit board 150 illustrated in FIG. 5, and circuit elements that can be mounted at predetermined positions in a circuit pattern P in the circuit board 150.

Similarly to the circuit module 120 of FIG. 2, the circuit module 160 of FIG. 6 is referenced to explain communication circuits and antennas that can be connected to connection terminals, and circuit elements that can be mounted in a circuit pattern. Thus, the circuit module 160 is different from an actual circuit module.

The circuit board 150 according to the second embodiment of the present disclosure corresponds to the case where, in the above-described first embodiment, 2.4 G WLAN performs communications of signals through first and second paths. Other portions are the same as in the first embodiment, and hence description of those portions is not repeated.

Thus, the communication circuit 12 for 2.4 G WLAN includes communication circuits 121 and 122 in the first and second paths, respectively. Furthermore, the second communication circuit connection terminal T12 includes communication circuit connection terminals T121 and T122 in the first and second paths, the communication circuit connection terminals T121 and T122 being connected respectively to the communication circuits 121 and 122 in the first and second paths.

<Circuit Elements>

The circuit elements, which can be mounted in the circuit pattern P illustrated in FIG. 5, include a capacitor 47 in addition to the circuit elements in the first embodiment, as illustrated in FIG. 6.

In the second embodiment, as described above, 2.4 G WLAN performs communications of signals through the first and second paths.

The optional elements in the second embodiment are electronic components that are to be mounted or not to be mounted in the circuit pattern P depending on whether the second antenna 22 is connected to the second antenna connection terminal T22.

The basic elements are electronic components that are to be mounted in the circuit pattern P regardless of whether the optional elements are mounted. In the second embodiment, the basic elements include electronic components to make communication feasible through 5 G WLAN. The basic elements further include electronic components to make communication feasible through the first path for 2.4 G WLAN in cooperation with the optional elements.

More specifically, in FIG. 6, the capacitors 33 and 38 and the coils 52 and 54 correspond to the optional elements. The capacitors 31, 32, 34 to 37, 39, 41, 42, 44, 45 and 47 and the coils 51, 53 and 55 to 59, the filters 61 to 63, and the switches 71 and 72 correspond to the basic elements.

<Circuit Pattern>

The circuit pattern P in the second embodiment is formed by replacing the communication circuit 12 for 2.4 G WLAN in the first embodiment with the communication circuit 121 for 2.4 G WLAN in the first path, and by connecting the communication circuit 122 for 2.4 G WLAN in the second path to the third antenna 23.

In other words, the circuit pattern P in the second embodiment is designed by adding, to the pattern P-C or P-D in the first embodiment, a circuit configuration in which the communication circuit 122 for 2.4 G WLAN in the second path is connected to the third antenna 23 to make communication feasible through the second path for 2.4 G WLAN.

The above added circuit configuration is disposed independently of the circuits that are constituted to perform communications through 5 G WLAN, the first path for 2.4 G WLAN, and 2.4 G BT.

Here, the capacitor 44 and the coil 57 form an ESD protective circuit for dropping a surge down to the ground. The capacitor 39 and the coil 55 form a trap circuit for dropping a noise signal down to the ground. The capacitor 47 and the coil 59 form a low-pass matching circuit allowing a signal in the 2.4 GHz band to pass therethrough. Description of circuit design of portions common to those in the patterns P-C and P-D is not repeated.

As in the first embodiment, with use of the circuit board 150 illustrated in FIG. 5, even when a demand for the antenna configuration is changed in circuit design, it is not required to increase the number of types of circuit boards in order to realize individual designed circuits in the form of modules. Hence development, setups for commercialization, and manufacturing of the circuit modules can be progressed efficiently.

Figure 11:
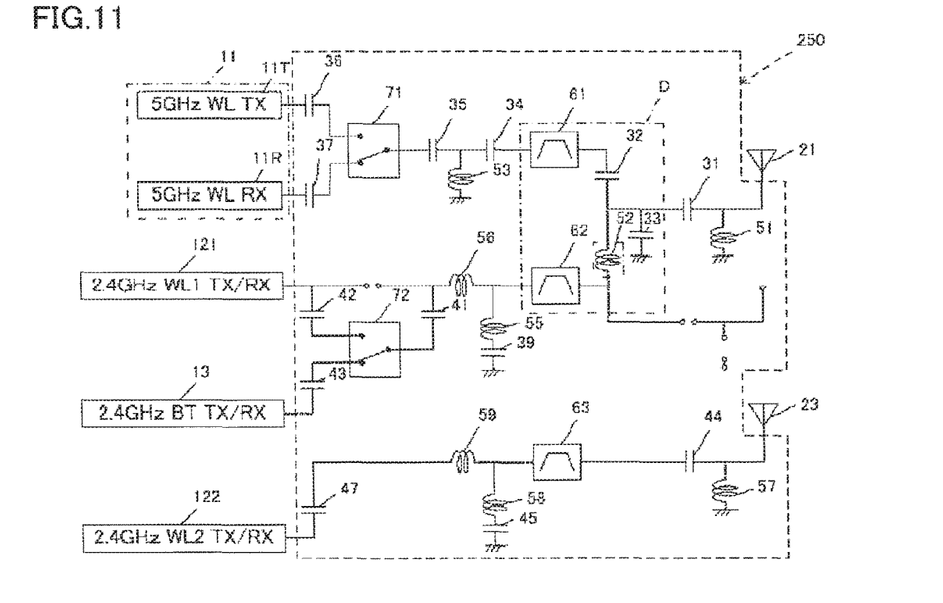
FIG. 11 is a circuit diagram illustrating a configuration of a circuit module 250 according to a fifth embodiment of the present disclosure.

Furthermore, in the circuit board 150 according to the second embodiment of the present disclosure, as illustrated in FIG. 11 described later, the first coil 52 and the second capacitor 33 among the optional elements are mounted in the circuit pattern P. With the mounting of those optional elements, the second communication circuit connection terminal T12 is connected to the first antenna connection terminal T21 and the diplexer circuit D is formed at the same time, as in the circuit board 110 according to the first embodiment.

In other words, just by mounting the predetermined electronic components among the optional elements, it is possible not only to change over the paths through which the communication circuit connection terminals are to be connected to the antenna connection terminal, but also to form the diplexer circuit D that changes over the radio frequency band to be utilized in the communication.

—First to Fourth Embodiments of Circuit Module—

Circuit modules 210 to 240 according to the first to fourth embodiments of the present disclosure will be described below with reference to FIGS. 7 to 10.

FIGS. 7 to 10 illustrate circuit modules obtained by mounting, in the circuit pattern P on the circuit board 110 according to the first embodiment of the present disclosure, the predetermined circuit elements in order to realize the above-described patterns P-A to P-D, respectively.

The circuit module 210 according to the first embodiment, illustrated in FIG. 7, is interposed between the first antenna 21 and a communication circuit group. The communication circuit group includes the communication circuit 11 for 5 G WLAN and the communication circuit 12 for 2.4 G WLAN.

This circuit module is intended to implement the following configuration when 2.4 G BT performs communication with use of the third antenna 23 in the circuit pattern P on the circuit board 110 according to the first embodiment of the present disclosure. More specifically, the first antenna 21 is connected to the first antenna connection terminal T21. The second antenna 22 is not connected to the second antenna connection terminal T22. Furthermore, the first coil 52 and the second capacitor 33 among the optional elements, and the basic elements are mounted in the circuit pattern P. Moreover, the remaining optional elements, i.e., the capacitor 38 and the coil 54, are not mounted in the circuit pattern P.

Figure 8:
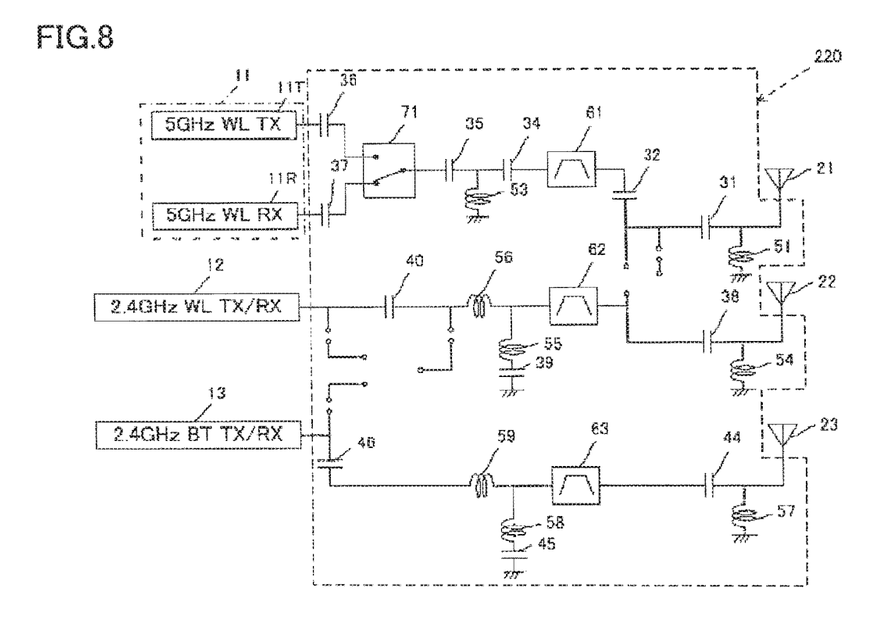
FIG. 8 is a circuit diagram illustrating a configuration of a circuit module 220 according to the second embodiment of the present disclosure.

The circuit module 220 according to the second embodiment, illustrated in FIG. 8, is interposed between an antenna group and a communication circuit group. The antenna group includes the first and second antennas 21 and 22. The communication circuit group includes the communication circuit 11 for 5 G WLAN and the communication circuit 12 for 2.4 G WLAN.

This circuit module is intended to implement the following configuration when 2.4 G BT performs communication with use of the third antenna 23, as in the above case, in the circuit pattern P on the circuit board 110 according to the first embodiment of the present disclosure. More specifically, the first and second antennas 21 and 22 are connected to the first and second antenna connection terminals T21 and T22, respectively. Furthermore, the first coil 52 and the second capacitor 33 among the optional elements are not mounted in the circuit pattern P. Moreover, the remaining optional elements, i.e., the capacitor 38 and the coil 54, and the basic elements are mounted in the circuit pattern.

The circuit module 230 according to the third embodiment, illustrated in FIG. 9, is interposed between the first antenna 21 and a communication circuit group. The communication circuit group includes the communication circuit 11 for 5 G WLAN, the communication circuit 12 for 2.4 G WLAN, and the communication circuit 13 for 2.4 G BT.

This circuit module is intended to implement the following configuration when 2.4 G BT performs communication without necessarily employing the third antenna 23 in the circuit pattern P on the circuit board 110 according to the first embodiment of the present disclosure. More specifically, the first antenna 21 is connected to the first antenna connection terminal T21. The second antenna 22 is not connected to the second antenna connection terminal T22. Furthermore, the first coil 52 and the second capacitor 33 among the optional elements, and the basic elements are mounted in the circuit pattern P. Moreover, the remaining optional elements, i.e., the capacitor 38 and the coil 54, are not mounted in the circuit pattern P.

Figure 10:
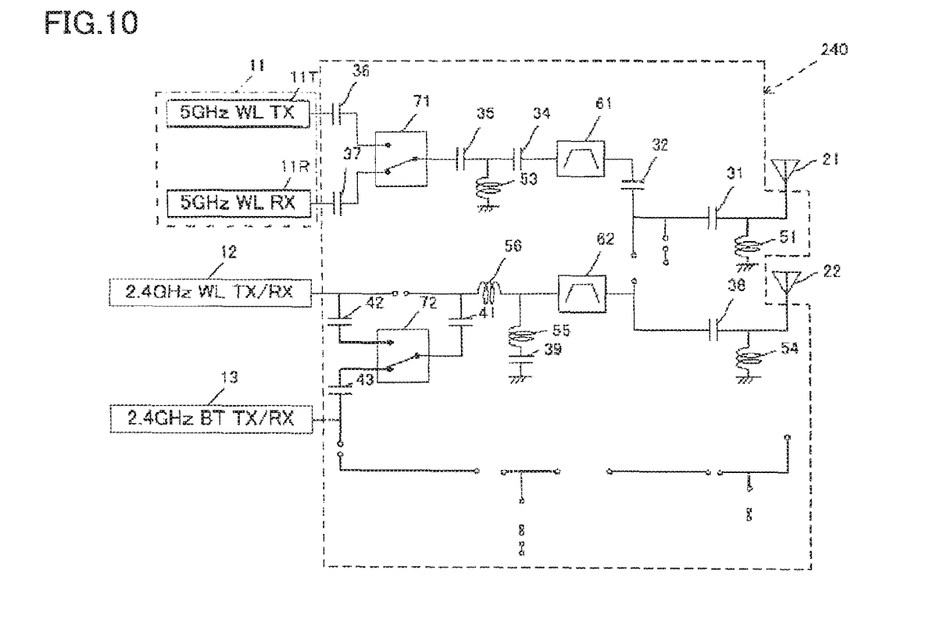
FIG. 10 is a circuit diagram illustrating a configuration of a principal portion of a circuit module 240 according to a fourth embodiment of the present disclosure.

The circuit module 240 according to the fourth embodiment, illustrated in FIG. 10, is interposed between an antenna group and a communication circuit group. The antenna group includes the first and second antennas 21 and 22. The communication circuit group includes the communication circuit 11 for 5 G WLAN, the communication circuit 12 for 2.4 G WLAN, and the communication circuit 13 for 2.4 G BT.

This circuit module is intended to implement the following configuration when 2.4 G BT performs communication, as in the above case, without necessarily employing the third antenna 23 in the circuit pattern P on the circuit board 110 according to the first embodiment of the present disclosure. More specifically, the first and second antennas 21 and 22 are connected to the first and second antenna connection terminals T21 and T22, respectively. Furthermore, the first coil 52 and the second capacitor 33 among the optional elements are not mounted in the circuit pattern P. Moreover, the remaining optional elements, i.e., the capacitor 38 and the coil 54, and the basic elements are mounted in the circuit pattern.

Since the circuit modules 210 to 240 according to the first to fourth embodiments are formed on the individual common circuit boards, many of items for reliability evaluation can be shared in tests of the circuit modules. As a result, labor and time required to perform the reliability test for each of the circuit modules can be reduced.

Hence development, setups for commercialization, and manufacturing of the circuit modules can be progressed efficiently.

—Fifth and Sixth Embodiments of Circuit Module—

Circuit modules 250 and 260 according to fifth and sixth embodiments of the present disclosure will be described below with reference to FIGS. 11 and 12.

Figure 12:
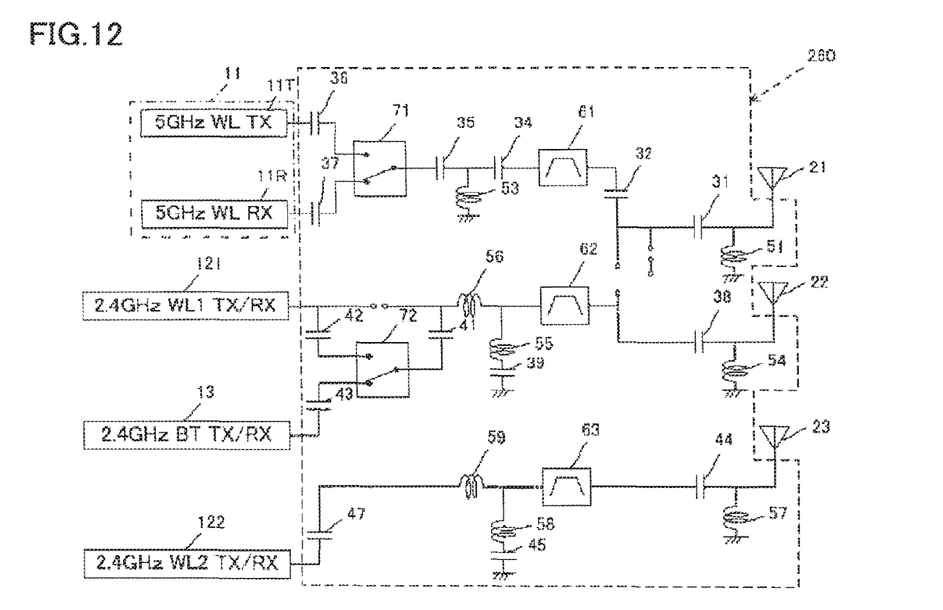
FIG. 12 is a circuit diagram illustrating a configuration of a circuit module 260 according to a sixth embodiment of the present disclosure.

FIGS. 11 and 12 illustrate circuit modules obtained by mounting the predetermined circuit elements in the circuit pattern P on the circuit board 150 according to the second embodiment of the present disclosure.

The circuit module 250 according to the fifth embodiment, illustrated in FIG. 11, is interposed between an antenna group and a communication circuit group. The antenna group includes the first and third antennas 21 and 23. The communication circuit group includes the communication circuit 11 for 5 G WLAN, the communication circuit 121 in the first path and the communication circuit 122 in the second path for 2.4 G WLAN, and the communication circuit 13 for 2.4 G BT.

This circuit module is intended to implement the following configuration in the circuit pattern P on the circuit board 110 according to the second embodiment of the present disclosure. More specifically, the second antenna 22 is not connected to the second antenna connection terminal T22. The first coil 52 and the second capacitor 33 among the optional elements, and the basic elements are mounted in the circuit pattern P. The remaining optional elements, i.e., the capacitor 38 and the coil 54, are not mounted in the circuit pattern P.

The circuit module 260 according to the sixth embodiment, illustrated in FIG. 12, is interposed between an antenna group and a communication circuit group. The antenna group includes the first to third antennas 21 to 23. The communication circuit group includes the communication circuit 11 for 5 G WLAN, the communication circuit 121 in the first path and the communication circuit 122 in the second path for 2.4 G WLAN, and the communication circuit 13 for 2.4 G BT.

This circuit module is intended to implement the following configuration in the circuit pattern P on the circuit board 150 according to the second embodiment of the present disclosure. More specifically, the second antenna 22 is connected to the second antenna connection terminal T22. The first coil 52 and the second capacitor 33 among the optional elements are not mounted in the circuit pattern P. The remaining optional elements, i.e., the capacitor 38 and the coil 54, and the basic elements are mounted in the circuit pattern.

Since the circuit modules 250 and 260 according to the fifth and sixth embodiments are formed on the individual common circuit boards, many of items for reliability evaluation can be shared in tests of the circuit modules. As a result, labor and time required to perform the reliability test for each of the circuit modules can be reduced.

Hence development, setups for commercialization, and manufacturing of the circuit modules can be progressed efficiently.

While FIGS. 11 and 12 illustrate, by way of example, the configuration of changing over 2.4 G WLAN and 2.4 G BT with the switch 72, another configuration (not illustrated) of not changing over 2.4 G WLAN and 2.4 G BT with the switch 72 can also be similarly implemented with the circuit board according to the present disclosure.

It is to be noted that the present disclosure is not limited to the above embodiments, and a variety of applications or modifications can be made with respect to the communication circuits and the circuit configurations in the wireless communication systems within the scope of the present disclosure.

In the above embodiments, the basic elements and the optional elements are constituted by capacitors, coils, filters, and switches. However, the above embodiments are merely illustrative, and the basic elements and the optional elements are not always limited to the components constituting the configurations described above. For example, when the ESD circuit is considered to be not needed in the circuit module, the circuit module may be implemented in a configuration not including the capacitor and the coil that constitute the ESD circuit. When the trap circuit is considered to be not needed in the circuit module, the circuit module may be implemented in a configuration not including the capacitor and the coil that constitute the trap circuit.

Furthermore, while 5 G WLAN is regarded as the first wireless communication system and 2.4 G WLAN is regarded as the second wireless communication system in the above embodiments, the frequency bands and the communication standards are not limited to those examples. In the wireless communication systems, the frequency bands may be replaced with other suitable frequency bands, and the communication standards may be replaced with other suitable communication standards.

REFERENCE SIGNS LIST 11 communication circuit in first communication wireless system, 12 communication circuit in second communication wireless system, 21 first antenna, 22 second antenna, 23 third antenna, 32 first capacitor, 33 second capacitor, 52 first coil, 61 first filter, 62 second filter, 63 third filter, 110, 150 circuit board, 121 communication circuit in first path, 122 communication circuit in second path, 210 to 260 circuit modules, B board base element, D diplexer circuit, P circuit pattern, T10 communication circuit connection terminal, T11 first communication circuit connection terminal, T12 second communication circuit connection terminal, T121 communication circuit connection terminal in first path, T122 communication circuit connection terminal in second path, T20 antenna connection terminal, T21 first antenna connection terminal, T22 second antenna connection terminal, and T23 third antenna connection terminal.

The invention claimed is:

1. A circuit board comprising:
a board base;
a communication circuit connection terminal comprising first and second communication circuit connection terminals respectively connected to communication circuits in first and second wireless communication systems utilizing different radio frequency bands;
an antenna connection terminal comprising first and second antenna connection terminals respectively connectable to first and second antennas; and
a circuit pattern formed to receive a plurality of predetermined circuit elements by mounting the plurality of predetermined circuit elements to the board base in the circuit pattern, wherein the plurality of predetermined circuit elements include:
first electronic components that are mounted depending on whether the second antenna is connected to the second antenna connection terminal, the first electronic components being a first capacitor or a first coil, and a second capacitor; and
basic electronic components that are mounted regardless of whether the first electronic components are mounted, the basic electronic components being the other of the first capacitor and the first coil, and first and second filters,
wherein the circuit pattern is configured to form communication paths based on which of the plurality of predetermined circuit elements are mounted and which antennas are connected to their respective antenna connection terminals, and
wherein the circuit pattern is formed to have a configuration that:
when the second antenna is not connected to the second antenna connection terminal and when the first electronic components and the basic electronic components are mounted in the circuit pattern, the first and second communication circuit connection terminals are connected to the first antenna connection terminal through a diplexer circuit comprising the first and second capacitors, the first coil, and the first and second filters, and communication is performed by the first and second wireless communication systems, or when the second antenna is connected to the second antenna connection terminal, when the first electronic components are not mounted in the circuit pattern, and when the basic electronic components are mounted in the circuit pattern, the first communication circuit connection terminal and the first antenna connection terminal are connected through the first filter, the second communication circuit connection terminal and the second antenna connection terminal are connected through the second filter, and communication is performed by the first and second wireless communication systems.

2. The circuit board according to claim 1, wherein:
the second wireless communication system performs communications of signals through a plurality of paths including first and second paths,
the communication circuit in the second wireless communication system includes communication circuits in the first and second paths,
the second communication circuit connection terminal includes communication circuit connection terminals in the first and second paths, the communication circuit connection terminals being respectively connected to the communication circuits in the first and second paths,
the antenna connection terminal further includes a third antenna connection terminal to which a third antenna is connected, and
the basic electronic components further comprise a third filter.

3. The circuit board according to claim 2, wherein the circuit pattern is formed to have a configuration that:
when the second antenna is not connected to the second antenna connection terminal and when the first electronic components and the basic electronic components are mounted in the circuit pattern, the first communication circuit connection terminal and the communication circuit connection terminal in the first path are connected to the first antenna connection terminal through a diplexer circuit that includes the first and second capacitors, the first coil, and the first and second filters, the communication circuit connection terminal in the second path is connected to the third antenna connection terminal through the third filter, and communication is performed by the first and second wireless communication systems, or
when the second antenna is connected to the second antenna connection terminal, when the first electronic components are not mounted in the circuit pattern, and when the basic electronic components are mounted in the circuit pattern, the first communication circuit connection terminal and the first antenna connection terminal are connected through the first filter, the communication circuit connection terminal in the first path and the second antenna connection terminal are connected through the second filter, the communication circuit connection terminal in the second path and the third antenna connection terminal are connected through the third filter, and communication is performed by the first and second wireless communication systems.

4. A circuit module comprising the circuit board according to claim 3, the circuit module being interposed between the first and third antennas and the communication circuits in the first and second wireless communication systems,
wherein the circuit module is constituted in the circuit board such that:

the second antenna is not connected to the second antenna connection terminal, and the first electronic components and the basic electronic components are mounted in the circuit pattern.

5. A circuit module comprising the circuit board according to claim 3, the circuit module being interposed between the first to third antennas and the communication circuits in the first and second wireless communication systems, wherein the circuit module is constituted in the circuit board such that:

the second antenna is connected to the second antenna connection terminal, the first electronic components are not mounted in the circuit pattern, and the basic electronic components are mounted in the circuit pattern.

6. A circuit module comprising the circuit board according to claim 1, the circuit module being interposed between the first antenna and the communication circuits in the first and second wireless communication systems, wherein the circuit module is constituted in the circuit board such that:

the second antenna is not connected to the second antenna connection terminal, and the first electronic components and the basic electronic components are mounted in the circuit pattern.

7. A circuit module comprising the circuit board according to claim 1, the circuit module being interposed between the first and second antennas and the communication circuits in the first and second wireless communication systems, wherein the circuit module is constituted in the circuit board such that:

the second antenna is connected to the second antenna connection terminal, and the first electronic components are not mounted in the circuit pattern, and the basic electronic components are mounted in the circuit pattern.

* * * * *